(12) United States Patent
Takeuchi et al.

(10) Patent No.: US 6,677,615 B2
(45) Date of Patent: Jan. 13, 2004

(54) SEMICONDUCTOR LIGHT-EMITTING DEVICE, ELECTRODE FOR THE DEVICE, METHOD FOR FABRICATING THE ELECTRODE, LED LAMP USING THE DEVICE, AND LIGHT SOURCE USING THE LED LAMP

(75) Inventors: Ryouichi Takeuchi, Chichibu (JP); Kazuhiro Mitani, Chichibu (JP); Wataru Nabekura, Chichibu (JP); Takashi Udagawa, Chichibu (JP); Takaharu Hoshina, Chichibu (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 10/265,148

(22) Filed: Oct. 7, 2002

(65) Prior Publication Data

US 2003/0052323 A1 Mar. 20, 2003

Related U.S. Application Data

(63) Continuation of application No. 09/691,057, filed on Oct. 19, 2000, now Pat. No. 6,512,248.
(60) Provisional application No. 60/164,861, filed on Nov. 12, 1999.

(30) Foreign Application Priority Data

| Oct. 19, 1999 | (JP) | ............................................. 11-296374 |
| Nov. 17, 1999 | (JP) | ............................................. 11-326208 |
| Nov. 19, 1999 | (JP) | ............................................. 11-329755 |
| Aug. 11, 2000 | (JP) | ........................................ 2000-243992 |

(51) Int. Cl.$^7$ .................................................. H01L 29/78
(52) U.S. Cl. ............................................ 257/81; 257/99
(58) Field of Search ...................................... 257/81, 99

(56) References Cited

U.S. PATENT DOCUMENTS

| 6,078,064 A | 6/2000 | Ming-Jiunn et al. |
| 6,225,648 B1 | 5/2001 | Hsieh et al. |
| 2002/0000563 A1 | 1/2002 | Udagawa |

FOREIGN PATENT DOCUMENTS

| JP | 57-111076 | 7/1982 |
| JP | 58-89956 | 6/1983 |
| JP | 8-83927 | 3/1996 |
| JP | 10-173224 | 6/1998 |
| JP | 11-17220 | 1/1999 |

*Primary Examiner*—Stephen D. Meier
(74) *Attorney, Agent, or Firm*—Sughrue Mion, PLLC (57) ABSTRACT

A semiconductor light-emitting device includes a semiconductor substrate that has a rear surface formed with a first electrode, a semiconductor layer that includes a light-emitting portion and is formed on the semiconductor substrate, a plurality of dispersed electrodes that are individually formed on a part of the surface of the semiconductor layer to make ohmic contact with the semiconductor layer, a transparent conductive film that covers the surface of the semiconductor layer and the dispersed electrodes to electrically conduct with the dispersed electrodes, and a pad electrode that is formed on a part of the surface of the transparent conductive film to electrically conduct with the transparent conductive film.

18 Claims, 9 Drawing Sheets

SEMICONDUCTOR LIGHT-EMITTING DEVICE, ELECTRODE FOR THE DEVICE, METHOD FOR FABRICATING THE ELECTRODE, LED LAMP USING THE DEVICE, AND LIGHT SOURCE USING THE LED LAMP

CROSS REFERENCE TO RELATED APPLICATIONS

This is a continuation of application Ser. No. 09/691,057 filed Oct. 19, 2000 now U.S. Pat. No. 6,512,248, which claims benefit of provisional application No. 60/164,861 filed Nov. 12, 1999; the above noted prior applications are all hereby incorporated by reference.

BACKGROUND OF THE INVENTION

1. Field of the Invention

The present invention relates to a semiconductor light-emitting device that emits light in the green color to red-color bands, an electrode for the semiconductor light-emitting device, a fabrication method of the electrode, an LED lamp using the semiconductor light-emitting device, and a light source using the LED lamp.

2. Description of the Prior Art

As light-emitting devices such as a light-emitting diode (LED) and a laser diode (LD) which emit light in the reddish-orange band, a light-emitting device including a light-emitting portion structure formed of a mixed crystal layer of $(Al_XGa_{1-X})_YIn_{1-Y}P$ ($0 \leq X \leq 1, 0 < Y < 1$) has heretofore been known, for example, in JP-A HEI 8(1996)-83927. The light-emitting device disclosed in this publication of the unexamined application is constructed in such a manner that a transparent conductive film made of indium tin oxide is stacked on the surface of the light-emitting portion made of the mixed crystal layer of $(Al_XGa_{1-X})_YIn_{1-Y}P$ and that an upper plane electrode is formed on the transparent conductive film. With this structure, current from the upper plane electrode is diffused to a region as wide as possible on the surface of the light-emitting portion via the transparent conductive film.

However, in the conventional light-emitting device, ohmic contact between the transparent conductive film and the surface of the light-emitting portion cannot be achieved sufficiently, and this is a main cause to increase a forward current and degrade service life characteristics. In order to improve this point, a window layer of JP-A HEI 11(1999)-17220, for example, is formed on the surface of a light-emitting potion, and a contact layer is formed on this window layer. Furthermore, a transparent conductive film (a conductive transparent oxide layer) made of indium tin oxide is stacked on the contact layer, and an upper plane electrode (an upper layer electrode) on the transparent conductive film, thus constituting a light-emitting device. Thus, a current from this upper plane electrode is diffused to a region as wide as possible on the surface of the light-emitting portion via the transparent conductive film, contact layer and window layer.

In the light-emitting device disclosed in JP-A HEI 11(1999)-17220, however, though the ohmic contact between the transparent conductive film and the semiconductor layer is improved, since the contact layer is provided, emitted light is absorbed by this contact layer. Accordingly, a high luminance light emission cannot be sufficiently achieved, and a light-emitting efficiency is not improved.

The present invention has been proposed considering the aforementioned problem. An object of the present invention is to provide a semiconductor light-emitting device which is capable of realizing a good ohmic contact between an electrode and a semiconductor layer and significantly improving a light-emitting efficiency without absorption of emitted light, an electrode for the semiconductor light-emitting device, an LED lamp using the semiconductor light-emitting device, and a light source using the LED lamp.

SUMMARY OF THE INVENTION

To achieve the above object, the present invention provides a semiconductor light-emitting device which comprises: a semiconductor substrate having a rear surface on which a first electrode is formed; a semiconductor layer including a light emitting portion, that is formed on the semiconductor substrate; dispersed electrodes formed individually on a part of a surface of the semiconductor layer and making ohmic contact with the semiconductor layer; a transparent conductive film formed so as to cover the surface of the semiconductor layer and the dispersed electrodes, the transparent conductive film electrically conducting with the dispersed electrodes; and a pad electrode formed on a part of a surface of the transparent conductive film, the pad electrode electrically conducting with the transparent conductive film.

The semiconductor light-emitting device of the invention includes a configuration in which the dispersed electrodes are formed on the semiconductor layer surface around the pad electrode when viewed from above.

The semiconductor light-emitting device of the invention includes a configuration in which the dispersed electrodes are formed on the semiconductor layer surface at portions where the dispersed electrodes do not overlap the pad electrode when viewed from above.

The semiconductor light-emitting device of the invention includes a configuration in which the dispersed electrodes are not formed on the semiconductor layer surface at portions where the dispersed electrodes overlap the pad electrode when viewed from above.

The semiconductor light-emitting device of the invention further includes a feature that the total plane area of the dispersed electrodes is smaller than the area of the pad electrode.

The semiconductor light-emitting device of the invention includes a feature that the total plane area of the dispersed electrodes is 3% to 30% of the effective light emitting area.

The semiconductor light-emitting device of the invention includes a feature that the light-emitting portion is made of AlGaInP.

The semiconductor light-emitting device of the invention includes a feature that the semiconductor layer is formed by the metal organic chemical vapor deposition (MOCVD).

The semiconductor light-emitting device of the invention includes a feature that the transparent conductive film is made of indium tin oxide (ITO).

The semiconductor light-emitting device of the invention further includes a configuration in which the pad electrode is formed on the semiconductor layer via the transparent conductive film, but there is no transparent conductive layer on the surface of the pad electrode subjected to wire-bonding.

The semiconductor light-emitting device of the invention includes a configuration in which the pad electrode is formed on the semiconductor layer surface at the center when viewed from above.

The present invention further provides an electrode for the semiconductor light-emitting device, which comprises: dispersed electrodes formed individually on a part of a surface of the semiconductor layer including a light emitting portion, the dispersed electrodes making ohmic contact with the semiconductor layer; a transparent conductive film formed so as to cover the surface of the semiconductor layer and the dispersed electrodes, the transparent conductive film electrically conducting with the dispersed electrodes; and a pad electrode formed on a part of a surface of the transparent conductive film, the pad electrode electrically conducting with the transparent conductive film.

The electrode of the invention for the semiconductor light-emitting device includes a configuration in which the dispersed electrodes are formed on the semiconductor layer surface around the pad electrode when viewed from above.

The electrode of the invention for the semiconductor light-emitting device includes a configuration in which the dispersed electrodes are formed on the semiconductor layer surface at portions where the dispersed electrodes do not overlap the pad electrode when viewed from above.

The electrode of the invention for the semiconductor light-emitting device further includes a feature that the total plane area of the dispersed electrodes is smaller than the area of the pad electrode.

The electrode of the invention for the semiconductor light-emitting device includes a feature that the total plane area of the dispersed electrodes is 3 to 30% of the effective light emitting area.

The electrode of the invention for the semiconductor light-emitting device includes a feature that the transparent conductive film is made of indium tin oxide.

The electrode of the invention for the semiconductor light-emitting device further includes a configuration in which the pad electrode is formed on the semiconductor layer via the transparent conductive film, but there is no transparent conductive layer on the surface of the pad electrode subjected to wire-bonding.

The electrode of the invention for the semiconductor light-emitting device includes a configuration in which the pad electrode is formed on the semiconductor layer surface at the center when viewed from above.

The invention further provides a method for fabricating the electrode for the semiconductor light-emitting device comprising: a first step of forming dispersed electrodes individually on a part of a surface of a semiconductor layer including a light emitting portion, the dispersed electrodes making ohmic contact with the semiconductor layer; a second step of forming a transparent conductive film so as to cover the surface of the semiconductor layer and the dispersed electrodes, the transparent conductive film electrically conducting with the dispersed electrodes; and a third step of forming a pad electrode on a part of a surface of the transparent conductive film, the pad electrode electrically conducting with the transparent conductive film.

The electrode fabrication method of the invention includes a configuration in which the dispersed electrodes are formed on the semiconductor layer surface around the pad electrode when viewed from above.

The electrode fabrication method of the invention includes a configuration in which the dispersed electrodes are formed on the semiconductor layer surface at portions where the dispersed electrodes do not overlap the pad electrode when viewed from above.

The electrode fabrication method of the invention includes a configuration in which the dispersed electrodes are not formed on the semiconductor layer surface at portions where the dispersed electrodes overlap the pad electrode when viewed from above.

The electrode fabrication method of the invention includes a feature that the transparent conductive film is made of indium tin oxide.

The electrode fabrication method of the invention includes a feature that the transparent conductive film is formed by a spattering method, and the pad electrode is formed by a vapor deposition method.

The electrode fabrication method of the invention further includes a configuration in which the pad electrode is formed on the semiconductor layer via the transparent conductive film, but there is no transparent conductive layer on the surface of the pad electrode subjected to wire-bonding.

The invention further provides an LED lamp using the semiconductor light-emitting device.

The invention further provides a light source using the LED lamp.

In the present invention, since the dispersed electrodes are formed on a part of the surface of the semiconductor layer, as described above the electrical resistance between the semiconductor layer and the dispersed electrodes is made much smaller than that between the transparent conductive film and the semiconductor layer. Since a major part of a driving current supplied from the pad electrode flows through a path between the semiconductor layer and the dispersed electrodes having a smaller electrical resistance, light can be emitted from the light-emitting portion around the dispersed electrodes. Furthermore, since the major dispersed electrodes are disposed so as not to overlap the pad electrode, no light emission toward immediately below the pad electrode occurs. Therefore, a major part of light can be emitted upward without being intercepted by the pad electrode. Thus, the emission efficiency can be improved to a great extent.

The above and other objects, features and advantages of the present invention will become apparent from the description of the preferred embodiments of the invention made herein below with reference to the accompanying drawings.

BRIEF DESCRIPTION OF THE DRAWINGS

FIG. 9($a$) to FIG. 9($y$) are plan views each showing the arrangement of dispersed electrodes according to the present invention.

DESCRIPTION OF THE PREFERRED EMBODIMENTS

Embodiments of the present invention will be described in detail herein below with reference to the accompanying drawings.

Figure 1:
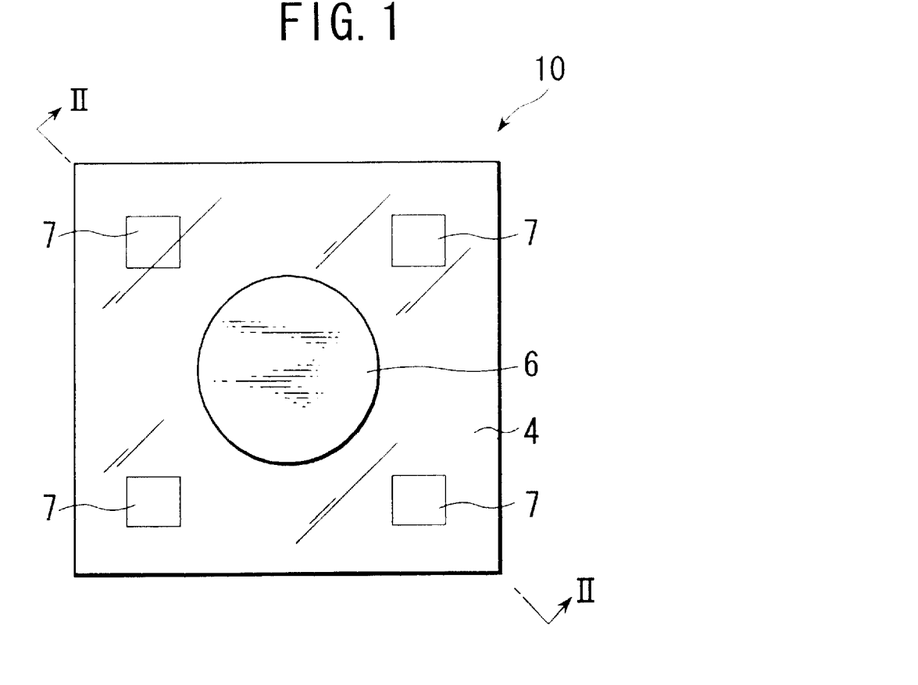
FIG. 1 is a schematic plan view showing the configuration of a semiconductor light-emitting device according to the present invention.
Figure 2:
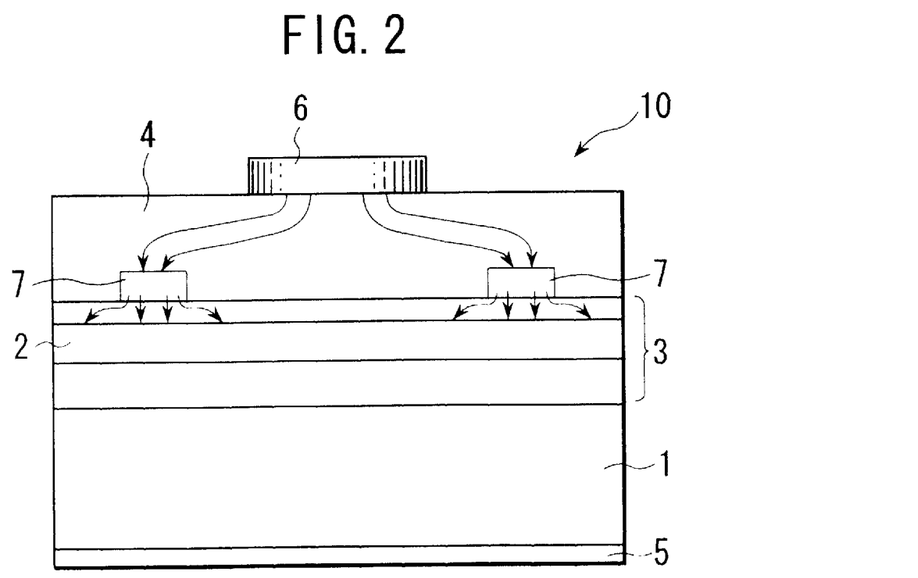
FIG. 2 is a cross section taken along line II—II in FIG. 1.

FIGS. 1 and 2 are schematic views showing the configuration of a semiconductor light-emitting device 10 according to the present invention, FIG. 1 being a plan view and FIG. 2 being a cross section taken along line II—II in FIG. 1.

The semiconductor light-emitting device 10 of the present invention comprises a semiconductor substrate 1 having a rear surface provided with a first electrode 5; a semiconductor layer 3 including a light-emitting portion 2, that is formed on the semiconductor substrate 1; dispersed electrodes 7 individually formed on a part of the surface of the semiconductor layer 3 to make ohmic contact with the semiconductor layer 3; a transparent conductive film 4 formed to cover the surface of the semiconductor layer 3 and the dispersed electrodes 7 and electrically conducted with the dispersed electrodes 7; and a pad electrode 6 formed on a part of the surface of the transparent conductive film 4 and electrically conducted with the transparent conductive film 4. As shown in FIG. 1, each of the dispersed electrodes 7 is disposed at a position where it does not overlap the pad electrode 6 when viewed from the above. It is preferable that each of the dispersed electrodes 7 is not disposed at a position where it overlaps the pad electrode 6. Furthermore, a junction between the dispersed electrodes 7 and the semiconductor layer 3 keeps a good ohmic contact to make an electrical resistance between them small. Another junction between the transparent conductive film 4 and the semiconductor layer 3 does not exhibit sufficient ohmic contact. Accordingly, an electrical resistance between them is large.

In the semiconductor light-emitting device 10, the dispersed electrodes are individually provided on a part of the surface of the semiconductor layer 3 so that they make ohmic contact with the semiconductor layer 3. This configuration enables the electrical resistance between the dispersed electrodes 7 and the semiconductor layer 3 to be much smaller than that between the transparent conductive film 4 and the semiconductor layer 3. The major part of a driving current supplied from the pad electrode 6 flows through a path from the pad electrode 6 to the semiconductor layer 3 (the light-emitting portion 2) via the transparent conductive film 4 and the dispersed electrodes 7. This offers a smaller electrical resistance, as shown by the arrows in FIG. 2. For this reason, it is possible to allow the light-emitting portion 2 to emit light at the periphery of the dispersed electrodes 7. Accordingly, the driving current from the pad electrode 6 can be spread to a wide region on the surface of the semiconductor layer 3 in accordance with the planar arrangement of the dispersed electrodes 7. The emitted light can be taken out from the upper part of the light-emitting device 10 via the transparent conductive film 4. Since the dispersed electrodes 7 are arranged so that they do not overlap the pad electrode 6 as described above, a light emission toward just below the pad electrode 6 does not occur. A major part of the emitted light is not intercepted by the pad electrode 6 and is taken out from the upper part of the semiconductor light-emitting device 10, thus improving a light-emitting efficiency significantly.

Moreover, since the area of each of the dispersed electrodes 7 is set to be smaller than that of the pad electrode 6, light can be taken out to the outside of the semiconductor light-emitting device 10 with a high efficiency compared to conventional semiconductor light-emitting devices. Thus, the light-emitting efficiency can be increased still more.

Since the electrical resistance between the dispersed electrodes 7 and the semiconductor layer 3 is made smaller owing to the ohmic contact between them, as described above, it is possible to suppress an increase of a forward voltage of the semiconductor light-emitting device 10. The service life characteristic can thus be increased.

The transparent conductive film 4 is made of, for example, indium tin oxide (ITO) and possesses a good light transmissivity. Accordingly, the light emitted from the light-emitting portion 2 is little absorbed even during passing through the transparent conductive film 4, and the light can be taken out upward from the transparent conductive film 4 with a high efficiency.

The pad electrode 6 is subjected to wire-bonding for connecting the semiconductor light-emitting device 10 to an external electric circuit, and hence needs to have a some area. The emitted light based on the driving current flowing through a pad electrode in the direction just below the pad electrode was intercepted by the pad electrode, and could not be taken out to the outside of a conventional semiconductor light-emitting device. For this reason, a countermeasure such as provision of an insulating layer between the pad electrode and the light-emitting portion was taken to forcibly prevent the driving current from flowing from the pad electrode in the direction just below the pad electrode. In the present invention, however, the driving current can be guided to the individual dispersed electrodes 7 not overlapping the pad electrode. Accordingly, without provision of an insulating layer, it is possible to suppress the driving current flowing in the direction just below the pad electrode 6 with a more simplified constitution.

An area on the surface of the transparent conductive film 4 (the surface of the semiconductor layer 3 that becomes effective at the time of light emission is obtained by subtracting the area of the pad electrode 6 from the area of the surface of the transparent conductive film 4. This area will be called an effective light-emitting area S. The phenomenon that the pad electrode 6 obstructs takeout of the emitted light from the portion of the pad electrode 6 arises similarly in the dispersed electrodes 7. Accordingly, in the present invention, the total surface area of the dispersed electrodes 7 is set to be in the range of 3% to 30% of the effective light-emitting area S. This can eliminate the disadvantage in that the area of the dispersed electrodes 7 is so wide that takeout of the emitted light is excessively obstructed and the disadvantage in that the area of the dispersed electrodes 7 is so narrow that a forward voltage $V_f$ is increased.

Various embodiments of the semiconductor light-emitting device according to the present invention will be described in detail with reference to FIGS. 3 to 9.

Figure 3:
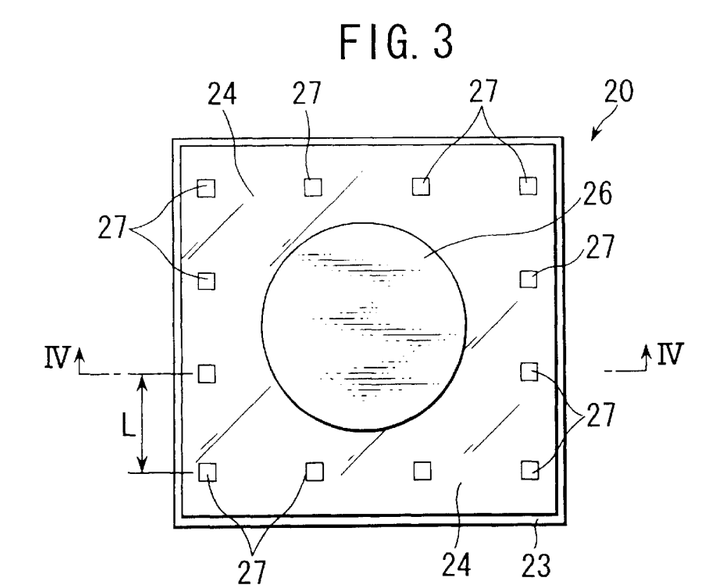
FIG. 3 is a plan view showing the configuration of a first embodiment of the semiconductor light-emitting device according to the present invention.
Figure 4:
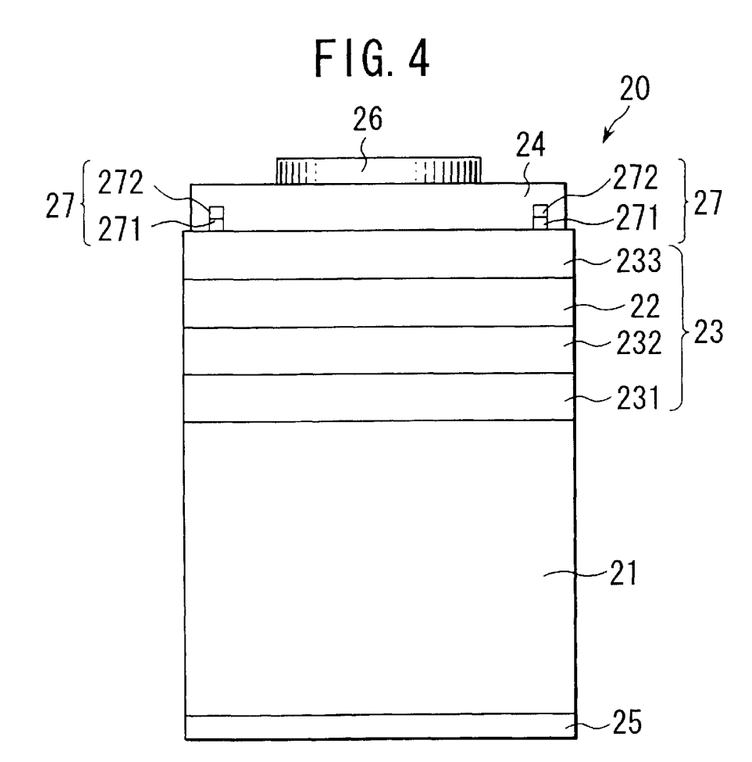
FIG. 4 is a cross section taken along line IV—IV in FIG. 3.

FIGS. 3 and 4 show a first embodiment of the semiconductor light-emitting device according to the present invention. FIG. 3 is a plan view thereof and FIG. 4 is a cross section taken along line IV—IV in FIG. 3. In these figures, the semiconductor light-emitting device 20 of the present invention is a light emitting diode (LED) for emitting a reddish-orange light. On a single crystal substrate 21 made of Zn-doped p-type (001)-GaAs, is formed a semiconductor layer 23 comprising a buffer layer 231 made of Zn-doped p-type GaAs, a lower dad layer 232 made of Zn-doped p-type $(Al_{0.7}Ga_{0.3})_{0.5}In_{0.5}P$, light-emitting layer 22 made of a mixed crystal of undoped n-type $(Al_{0.2}Ga_{0.8})_{0.5}In_{0.5}P$, and an upper dad layer 233 made of Si-doped n-type $(A_{0.7}G_{0.3})_{0.5}In_{0.5}P$, which are sequentially stacked.

Each of the layers 231, 232, 22 and 233 constituting the semiconductor layer 23 was grown on the substrate 21 under a reduced pressure by the metal organic chemical vapor deposition (MOCVD), using trimethyl aluminium $((CH_3)_3Al)$, trimethyl gallium $((CH_3)_3Ga)$ and trimethyl indium $((CH_3)_3In)$ as raw materials for Group-III constituent elements. Diethyl zinc $((C_2H_5)_2Zn)$ was used as a doping raw material of Zn. Disilane $(Si_2H_6)$ was used as an n-type doping raw material. Moreover, phosphine $(PH_3)$ or arsine $(AsH_3)$ was used as a raw material for Group-V constituent elements. The film growth temperature of each of the layers 231, 232, 22 and 233 was standardized to 730° C. The carrier concentration of the buffer layer 231 was set to be about $5 \times 10^{18}$ cm$^{-3}$, and the film thickness thereof was set to be about 0.5 $\mu$m. The carrier concentration of the lower dad layer 232 was set to be about $3 \times 10^{18}$ cm$^{-3}$, and the film thickness thereof was set to be about 1 $\mu$m. The film thickness of the light-emitting layer 22 was set to be about 0.5 $\mu$m, and the carrier concentration thereof was set to be about $5 \times 10^{16}$ cm$^{-3}$. The carrier concentration of the upper dad layer 233 was set to be about $2 \times 10^{18}$ cm$^{-3}$, and the film thickness thereof was set to be about 3 $\mu$m.

The lower dad layer 232, light-emitting layer 22 and upper dad layer 233 constitute a light-emitting portion of this semiconductor light-emitting device 20. Therefore, the light-emitting portion is made of AlGaInP.

In this semiconductor light-emitting device 20, a dispersed electrode 27 was formed by first forming a first film 271 of gold-germanium alloy (Au: 93% by weight+Ge: 7% by weight) having a thickness of about 50 nm on the entire surface of the upper dad layer 233 using a general vacuum deposition method, subsequently forming a second film 272 of Au having a thickness of about 50 nm on the surface of the first film, and using general photolithography means to pattern the two-film layer structure so that the two-film layer structure (dispersed electrode 27) was square-shaped with a side of about 20 $\mu$m. As shown in FIG. 3, twelve dispersed electrodes 27 each composed of the first film 271 and the second film 272 were provided so that they were symmetrically arranged on the surface of the upper dad layer 233 at positions other than the position just below a pad electrode 26. A distance L between the centers of the adjacent dispersed electrodes 27 was set to be 50 $\mu$m. After the dispersed electrodes 27 were formed on the surface of the upper dad layer 233, a heat treatment for alloying was performed for 15 minutes at 420° C. in the stream of Ar gas, thus forming ohmic contact between the dispersed electrodes 27 and the upper dad layer 233.

The upper dad layer 233 and the dispersed electrodes 27 on the surface of the upper dad layer 233 are covered by a transparent conductive film 24 that is made of indium tin oxide (ITO) by a general magnetron sputtering method. The specific resistance of the transparent conductive film 24 was about $4 \times 10^{-4}$ $\Omega \cdot$cm, and the thickness thereof was set to be about 600 nm. By a general X-ray diffraction analysis, the transparent conductive film 24 was found to be a polycrystalline film in which it is preferentially oriented to the direction of <0001> (C-axis).

An ordinary organic photoresist material was coated on the entire surface of the transparent conductive film 24 and then patterned utilizing a known photolithography technique to have a region where the pad electrode 26 is to be provided.

The region is set to include the center of the surface of the semiconductor light-emitting device shown in FIG. 3 (the intersection of the diagonals of a square). This is because the distance between the region and the individual dispersed electrodes 27 is made uniform to allow a current to uniformly flow through the dispersed electrodes 27 and through the whole of the semiconductor light-emitting device. A further reason is that the inclination of the semiconductor chip that would be formed during the wire-bonding process if the region should deviate greatly from the center can be prevented.

Thereafter, an Au film was formed by a vacuum deposition method on the entire surface of the patterned photoresist material. The thickness of the Au film was set to be about 700 nm. Thereafter, accompanied with peeling off the photoresist material, the Au film was formed by a well-known lift-off means so that it was laid restrictedly on the region where the pad electrode 26 is to be formed. Thus, the circular pad electrode 26 of Au having a diameter of about 110 $\mu$m was formed. The area of the pad electrode 26 was about $0.95 \times 10^{-4}$ cm$^2$.

On the other hand, a p-type ohmic electrode 25 of Au—Zn alloy was formed on the rear surface of the single crystal substrate 21. The semiconductor light-emitting device 20 thus fabricated was in the shape of a square having a side of 260 $\mu$m, so that the area of the transparent conductive film 24 was about $6.8 \times 10^{-4}$ cm$^2$. The effective light-emitting area S obtained by subtracting the area of the pad electrode 26 from the area of the transparent conductive film 24 was about $5.9 \times 10^{-4}$ cm$^2$. Moreover, the total area of the dispersed electrodes 27 was $0.48 \times 10^{-4}$ cm$^2$, and the ratio of this total area to the effective light-emitting area S was about 8.1%.

When a current flowed in the forward direction between the p-type ohmic electrode 25 and the pad electrode 26 of the semiconductor light-emitting device 20 fabricated in this manner, reddish-orange light having a wavelength of about 620 nm was emitted from the surface of the transparent conductive film 24. As a result of measurement by a monochrometer, a half bandwidth of the emission spectrum was about 20 nm, and a light emission excellent in monochromaticity was obtained. Reflecting a good ohmic characteristic of each dispersed electrode 27, a forward voltage $(V_f)$ per 20 mA when a current of 20 mA flowed was about 2.1 V. By virtue of the effect obtained by arranging the ohmic dispersed electrodes 27 at the peripheral region within the square of the semiconductor light-emitting device 20, a light emission was recognized also at the peripheral region. In the state where a visual sensitivity of the semiconductor light-emitting device 20 in the form of a chip was corrected utilizing a commercially available integrating sphere, the intensity of the emitted light simply measured was about 42 mcd. Moreover, since the driving current was uniformly applied to the individual dispersed electrodes 27, the distribution of the light emission intensity observed on the surface of the transparent conductive film 24 was substantially uniform.

COMPARATIVE EXAMPLE

A sample semiconductor light-emitting device (LED) was fabricated in the same manner as in the first embodiment for comparison with the semiconductor light-emitting device 20 in the first embodiment. However, this sample device was provided with an ohmic electrode having the same shape as the pad electrode 26 of the first embodiment. The ohmic electrode comprised a lower layer of Au—Ge alloy 50 nm in thickness that was formed directly on the surface of the upper dad layer 233 and an upper layer made of Au 50 nm in thickness. Therefore, the sample device did not have either the transparent conductive film 24 or the dispersed electrode 27.

The $V_f$ value (per 20 mA) of the sample device was about 2V, which was approximately equal to the $V_f$ value of the semiconductor light-emitting device 20 of the first embodiment. In the sample device, since the flat ohmic electrode having the total thickness of about 100 nm was provided directly on the upper dad layer 233, the light emission occurred only just below and around the ohmic electrode. A large amount of the emitted light was intercepted by the electrode and could not be taken out. As a result, the light emission intensity of the sample device was at a low level of about 20 mcd.

The semiconductor light-emitting device 20 of the first embodiment has a structure in which the ohmic dispersed electrodes 27 whose area of contact with the semiconductor layer 23 (the upper dad layer 233) is small are disposed without reducing the effective light-emitting area S and increasing the $V_f$ value. It is apparent that this structure enables high luminance to be realized.

Figure 5:
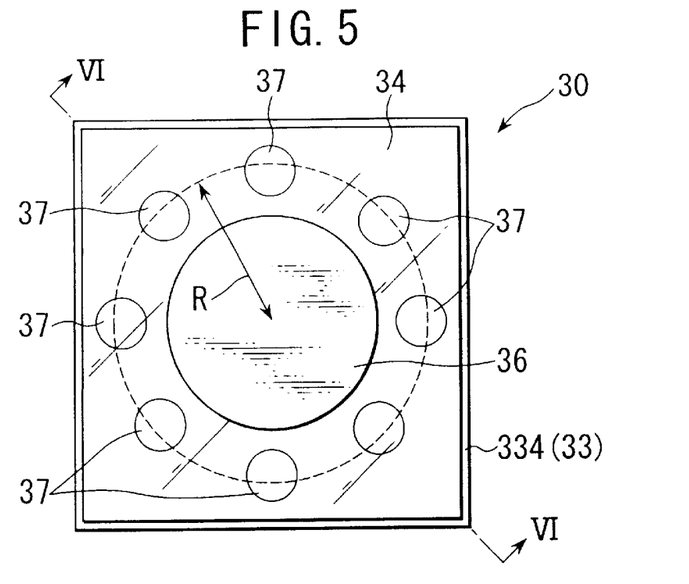
FIG. 5 is a plan view showing the configuration of a second embodiment of the semiconductor light-emitting device according to the present invention.
Figure 6:
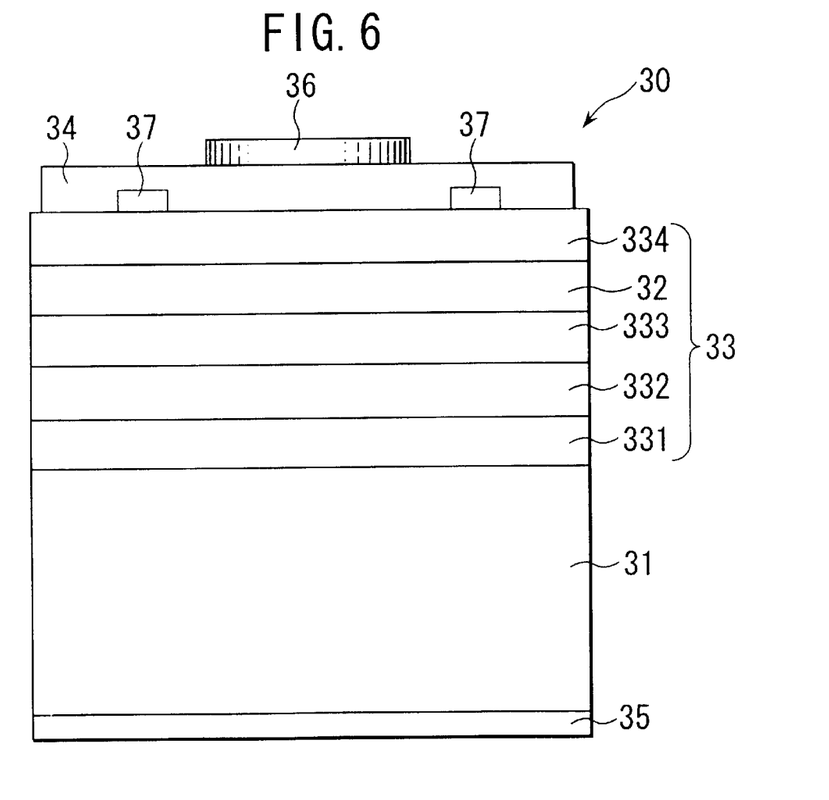
FIG. 6 is a cross section taken along line VI—VI in FIG. 5.

FIGS. 5 and 6 show a second embodiment of the semiconductor light-emitting device according to the present invention. FIG. 5 is a plan view of thereof and FIG. 6 is a cross section taken along line VI—VI in FIG. 5. In these figures, the semiconductor light-emitting device 30 is a light emitting diode (LED) which emits reddish-orange light. The semiconductor light-emitting device 30 is constituted by sequentially stacking on a single crystal substrate 31 of Si-doped n-type (001) 2°-off GaAs, a buffer layer 331 of Si-doped n-type GaAs, a Bragg reflection (DBR) layer 332 of a periodic structure in which 10 Si-doped n-type $Al_{0.40}Ga_{0.60}As$ layers and 10 n-type $Al_{0.95}Ga_{0.05}As$ layers are alternately stacked periodically, a lower dad layer 333 of Si-doped n-type $(Al_{0.7}Ga_{0.3})_{0.5}In_{0.5}P$, a light-emitting layer 32 made of a mixed crystal of undoped n-type $(Al_{0.2}Ga_{0.8})_{0.5}In_{0.5}P$, and an upper dad layer 334 of Mg-doped p-type $(Al_{0.7}Ga_{0.3})_{0.5}In_{0.5}P$ by a reduced-pressure MOCVD method. The foregoing layers 331, 332, 333, 32 and 334 constitute a semiconductor layer 33.

Each of the layers 331, 332, 333, 32 and 334 constituting the semiconductor layer 33 was grown by the reduced-pressure MOCVD method, using trimethyl aluminium $((CH_3)_3Al)$, trimethyl gallium $((CH_3)_3Ga)$ and trimethyl indium $((CH_3)_3In)$ as raw materials for Group-III constituent elements and using phosphine $(PH_3)$ or arsine $(AsH_3)$ as a raw material for Group-V constituent elements. Bis-cyclopentadienyl magnesium (bis-$(C_5H_5)_2Mg$) was used as a doping raw material of Mg. Disilane $(Si_2H_6)$ was used as an n-type doping raw material. The film growth temperature of each of the layers 331, 332, 333, 32 and 334 was standardized to 730° C. The carrier concentration of the buffer layer 331 was set to be about $3\times10^{18}$ cm$^{-3}$, and the thickness thereof was set to be about 500 nm. The thickness of each of the n-type $Al_{0.40}Ga_{0.60}As$ layers and the n-type $Al_{0.95}Ga_{0.05}As$ layers which constitute the DBR layer, was set to be about 40 nm. The carrier concentration of the lower dad layer 333 was set to be about $3\times10^{18}$ cm$^{-3}$, and the thickness thereof was set to be about 400 nm. The thickness of the light-emitting layer 32 was set to be about 10 nm, and the carrier concentration thereof was set to be about $1\times10^{17}$ cm$^{-3}$. The carrier concentration of the upper dad layer 334 was set to be about $4\times10^{18}$ cm$^{-3}$, and the thickness thereof was set to about 3 μm.

A film of Ni having a thickness of about 15 nm was coated on the entire surface of the upper dad layer 334 by a general electron beam vacuum deposition method. The Ni film was then patterned utilizing a general photolithography means, thus forming eight circular dispersed electrodes 37 each having a diameter of 20 μm on the upper dad layer 334. The dispersed electrodes 37 were disposed at regular intervals on a circle having a radius R of 95 μm from the center of a pad electrode 36 and on the diagonals on the surface of the upper dad layer 334 as well as between the diagonals, other than the region just below the pad electrode 36. After the dispersed electrodes 37 were formed, a heat treatment for alloying was performed, thus forming ohmic contact between the dispersed electrodes 37 and the upper dad layer 334.

After the dispersed electrodes 37 were formed on the upper dad layer 334, a film of indium tin oxide (ITO) was deposited on the upper dad layer 334 and the dispersed electrodes 37 as a transparent conductive film 34 by a general magnetron sputtering method. The specific resistance of the transparent film 34 was set to be about $4\times10^{-4}$ Ω·cm, and the thickness thereof was set to be about 600 nm. By a general X-ray diffraction analysis, the transparent conductive film 34 was found to be a polycrystalline film in which it is preferentially oriented to the direction of <0001> (C-axis). The transparent conductive film 34 was grown at a temperature of 250° C.

An ordinary organic photoresist material was coated on the entire surface of the transparent conductive film 34 and then a region where the pad electrode 36 is to be provided was patterned utilizing a known photolithography technique. Thereafter, a Ti film was formed on the entire surface of the patterned photoresist material by an electron beam vacuum deposition method. The thickness of the Ti film was set to be about 600 nm. Thereafter, accompanied with peeling off the photoresist material, the Ti film was laid by a well-known lift-off means restrictedly on the region where the pad electrode 36 is to be formed. Thus, the circular pad electrode 36 of Ti having a diameter of about 120 μm was formed on the transparent conductive film 34. The area of the pad electrode 36 was about $1.1\times10^{-4}$ cm$^2$.

An n-type ohmic electrode 35 of Au—Ge alloy was formed on a rear surface of the single crystal substrate 31. The semiconductor light-emitting device 30 thus fabricated was in the shape of a square having a side of 260 μm, so that the area of the transparent conductive film 34 became about $6.8\times10^{-4}$ cm$^2$. The effective light-emitting area S obtained by subtracting the area of the pad electrode 36 from the area of the transparent conductive film 34 was about $5.7\times10^{-4}$ cm$^2$. Moreover, the total area of the dispersed electrodes 37 was $0.25\times10^{-4}$ cm$^2$, and the ratio of this total area to the effective light-emitting area S was about 4.4%.

When current flowed in the forward direction between the n-type ohmic electrode 35 and the pad electrode 36, reddish-orange light having a wavelength of about 620 nm was emitted from the surface of the transparent conductive film 34. As a result of measurement by a monochrometer, a half bandwidth of the emission spectrum was about 20 nm, and a light emission excellent in monochromaticity was obtained. Reflecting a good ohmic characteristic of each dispersed electrode 37, a forward direction voltage ($V_f$) per 20 mA when a current of 20 mA flowed was about 2.1 V. By virtue of the effect obtained by arranging the ohmic dispersed electrodes 37 at the peripheral region within the square of the semiconductor light-emitting device 30, a light emission was recognized also at the peripheral region. In the state where a visual sensitivity of the semiconductor light-emitting device 30 in the form of a chip was corrected utilizing a commercially available integrating sphere, the intensity of the emitted light simply measured was about 74 mcd. Moreover, since the driving current was uniformly applied to the individual dispersed electrodes 37, the distribution of the light emission intensity observed on the surface of the transparent conductive film 34 was substantially uniform. The semiconductor light-emitting device 30 of the second embodiment also has a structure in which the ohmic dispersed electrodes 37 whose area of contact with the semiconductor layer 33 (the upper dad layer 233) is small are disposed without reducing the effective light-emitting area S and increasing the $V_f$ value. It is apparent that this structure enables high luminance to be realized.

Figure 7:
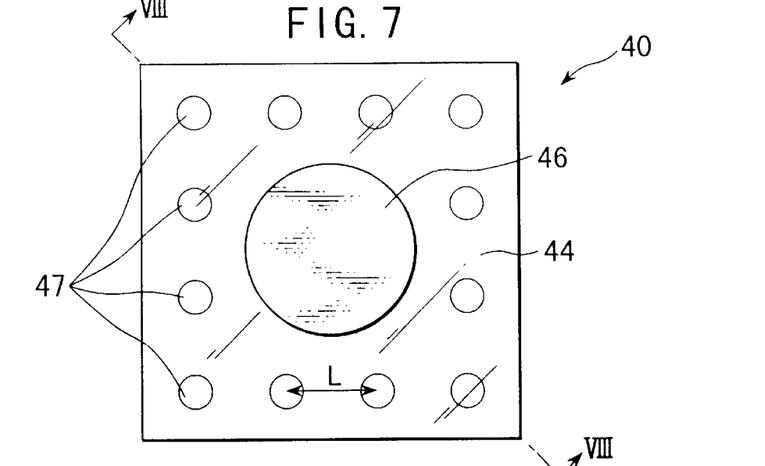
FIG. 7 is a plan view showing the configuration of a third embodiment of the semiconductor light-emitting device according to the present invention.
Figure 8:
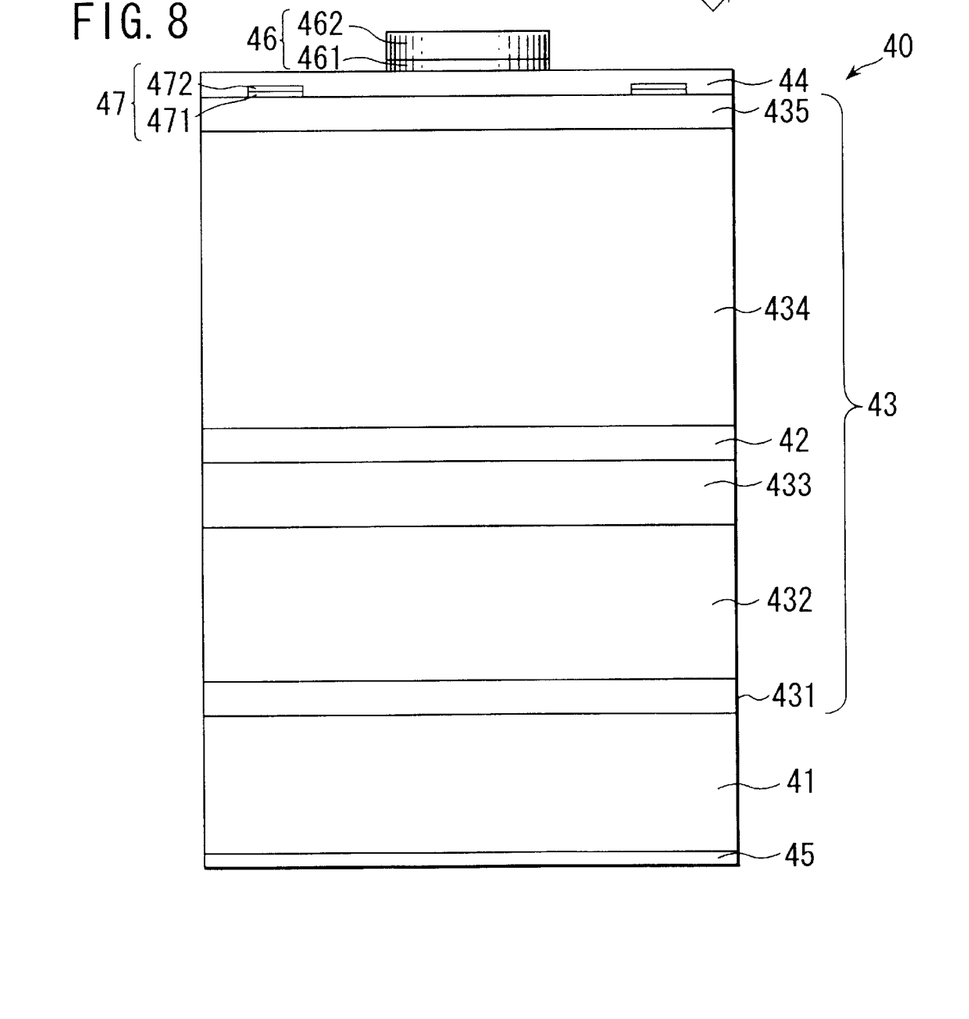
FIG. 8 is a cross section taken along line VIII—VIII in FIG. 7.

FIGS. 7 and 8 show a third embodiment of the semiconductor light-emitting device according to the present invention. FIG. 7 is a plan view thereof and FIG. 8 is a cross section taken along line VIII—VIII in FIG. 7. In these figures, the semiconductor light-emitting device 40 is a light emitting diode (LED) which emits yellowish-green light. The semiconductor light-emitting device 40 comprises a single crystal substrate 41 of Zn-doped p-type (001) 4°-off GaAs and a semiconductor layer 43 formed on the substrate. The semiconductor layer 43 comprises a buffer layer 431 of Zn-doped p-type GaAs, a Bragg reflection (DBR) layer 432 of a structure in which 12 $Al_{0.4}Ga_{0.6}As$ layers and 12 $Al_{0.9}Ga_{0.1}As$ layers are alternately stacked, a lower dad layer 433 of Zn-doped p-type $Al_{0.5}In_{0.5}P$, a light-emitting layer 42 made of a mixed crystal of undoped $(Al_{0.4}Ga_{0.6})_{0.5}In_{0.5}P$, an upper clad layer 434 made of a mixed crystal of Se-doped n-type $(Al_{0.7}Ga_{0.3})_{0.5}In_{0.5}P$, and a contact layer 435 made of a mixed crystal of Se-doped n-type $(Al_{0.7}Ga_{0.3})_{0.5}In_{0.5}P$, that are sequentially formed on the substrate 41.

Each of the layers 431, 432, 433, 42, 434 and 435 constituting the semiconductor layer 43 was grown by the reduced-pressure MOCVD method, using trimethyl aluminium $((CH_3)_3Al)$, trimethyl gallium $((CH_3)_3Ga)$ and trimethyl indium $(CH_3)_3In)$ as raw materials for Group-III constituent elements and using phosphine $(PH_3)$ or arsine $(AsH_3)$ as a raw material for Group-V constituent elements. Diethyl zinc $((C_2H_5)_2Zn)$ was used as a doping raw material of Zn. Hydrogen selenide $(H_2Se)$ was used as an n-type doping raw material. The film growth temperature of each of the layers 431, 432, 433, 42, 434 and 435 was standardized to 730° C. The carrier concentration of the buffer layer 431 was set to be about $5 \times 10^{18}$ cm$^{-3}$, and the thickness thereof was set to be about 0.5 µm. The carrier concentration of the DBR layer 432 was set to be about $1 \times 10^{18}$ cm$^{-3}$, and the thickness was set to be about 1 µm. The carrier concentration of the lower dad layer 433 was set to be about $3 \times 10^{17}$ cm$^{-3}$, and the thickness thereof was set to be about 1.5 µm. The thickness of the light-emitting layer 42 was set to be about 0.8 µm, and the carrier concentration thereof was set to be about $5 \times 10^{16}$ cm$^{-3}$. The carrier concentration of the upper dad layer 434 was set to be about $1 \times 10^{18}$ cm$^{-1}$, and the thickness thereof was set to about 5 µm. The carrier concentration of the contact layer 435 was set to be about $2 \times 10^{18}$ cm$^{-3}$, and the thickness thereof was set to about 0.5 µm.

The lower dad layer 433, light-emitting layer 42 and upper dad layer 434 constitute a light-emitting portion of this semiconductor light-emitting device 40. Therefore, the light-emitting portion is made of AlGaInP.

In this semiconductor light-emitting device 40, a dispersed electrode 47 was formed by first forming a first film 471 of gold-germanium alloy (Au: 93% by weight+Ge: 7% by weight) having a thickness of about 50 nm on the entire surface of the contact layer 435 using a general vacuum deposition method, subsequently forming a second film 272 of Au having a thickness of about 50 nm on the surface of the first film 471, and using general photolithography means to pattern the two-film layer structure so that the two-film layer structure (dispersed electrode 47) was circle-shaped with a diameter of about 20 µm. On the surface of the single crystal substrate 41 of GaAs opposite the surface thereof on which the semiconductor layer 43 was formed, a 150 nm-thick film of Au—Be alloy and a 800 nm-thick film of Au were vacuum-deposited to form a p-type ohmic electrode 45. As shown in FIG. 7, twelve dispersed electrodes 47 each composed of the first film 471 and the second film 472 were provided so that they were arranged on the surface of the contact layer 435 at positions other than the position just below a pad electrode 46. The distance L between the centers of the adjacent dispersed electrodes 47 was set to be 50 µm. A heat treatment for alloying was performed for 15 minutes at 420° C. in the stream of Ar gas, thus forming ohmic contact between the dispersed electrodes 47 and the contact layer 435 and between the single crystal substrate 41 of GaAs and the p-type ohmic electrode 45.

The contact layer 435 and the dispersed electrodes 47 were covered by a transparent conductive film 44 that was made of indium tin oxide (ITO) by a general magnetron sputtering method. The specific resistance of the transparent conductive film 44 was about $4 \times 10^{-4}$ Ω·cm, the transmissivity of visible light thereto was about 95%, and the thickness thereof was set to be about 300 nm. By a general X-ray diffraction analysis, the transparent conductive film 44 was found to be a polycrystalline film in which it is preferentially oriented to the direction of <0001> (C-axis).

A Cr film 461 and an Au film 462 were deposited on the entire surface of the transparent conductive film 44 by the sputtering method. The thickness of the Cr film 461 was 50 nm and that of the Au film was about 3000 nm.

An ordinary organic photoresist material was coated on the entire surface of the transparent conductive film 44 on which the Cr and Au films were deposited and then patterned utilizing a known photolithography technique to have a region where the pad electrode 26 is to be provided.

Thereafter, the Cr film 461 and Au film 462 in the region other than the patterned region were removed by etching. The photoresist material was then peeled off to obtain a circular pad electrode 46 consisting of the Cr film and Au film and having a diameter of about 110 µm was formed. The area of the pad electrode 46 was about $0.95 \times 10^{-4}$ cm$^2$.

The semiconductor light-emitting device 40 thus fabricated was in the shape of a square having a side of 260 µm, so that the area of the transparent conductive film 44 was about $6.8 \times 10^{-4}$ cm$^2$. The effective light-emitting area S obtained by subtracting the area of the pad electrode 46 from the area of the transparent conductive film 44 was about $5.9 \times 10^{-4}$ cm$^2$. Moreover, the total area of the dispersed electrodes 47 was $0.38 \times 10^{-4}$ cm$^2$, and the ratio of this total area to the effective light-emitting area S was about 6.4%.

When a current flowed in the forward direction between the p-type ohmic electrode 45 and the pad electrode 46 of the semiconductor light-emitting device 40 fabricated in this manner, yellowish-green light having a wavelength of about 573 nm was emitted from the surface of the transparent conductive film 44. Thus, an excellent light emission was obtained. Reflecting a good ohmic characteristic of each dispersed electrode 47, a forward voltage ($V_f$) per 20 mA when a current of 20 mA flowed was about 2.1 V. By virtue of the effect obtained by arranging the ohmic dispersed electrodes 47 at the peripheral region within the square of the semiconductor light-emitting device 40, a light emission was recognized also at the peripheral region. In the state where a visual sensitivity of the semiconductor light-emitting device 40 in the form of a chip was corrected utilizing a commercially available integrating sphere, the intensity of the emitted light simply measured was about 38 mcd. Moreover, since the driving current was uniformly applied to the individual dispersed electrodes 47, the distribution of the light emission intensity observed on the surface of the transparent conductive film 44 was substantially uniform.

Figure 9A:
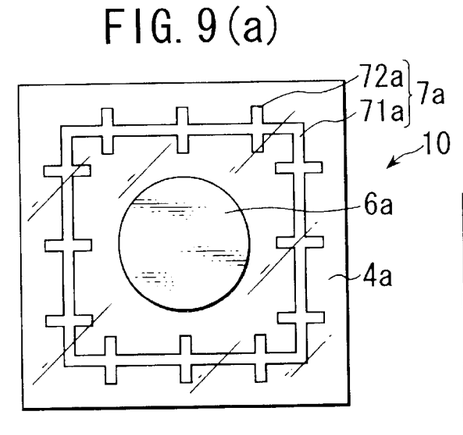
Figure 9B:
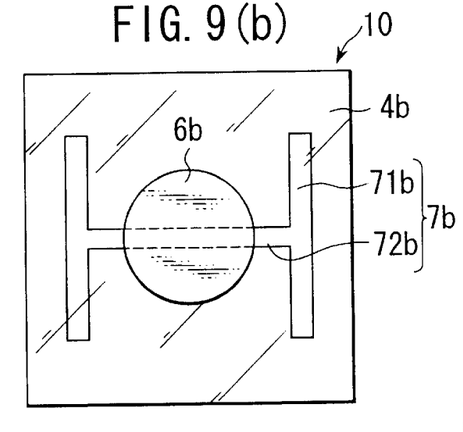
Figure 9C:
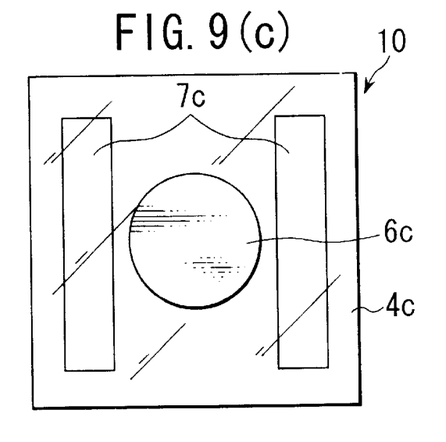
Figure 9D:
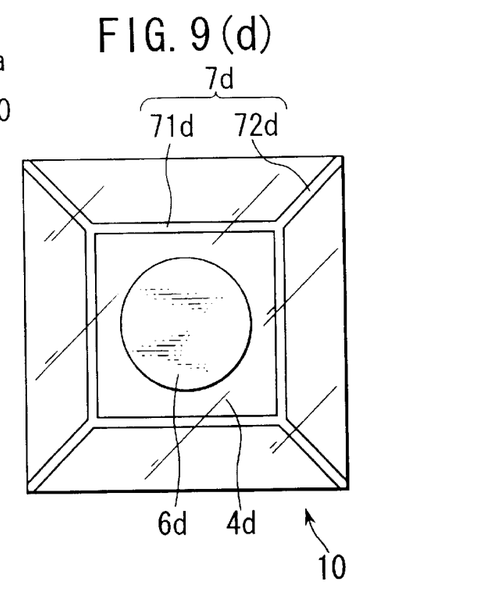
Figure 9E:
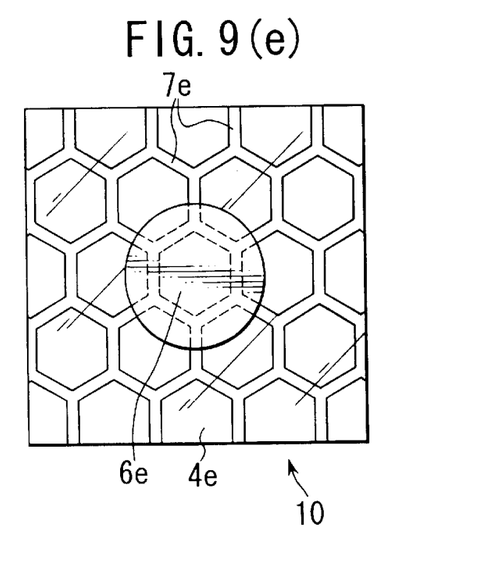
Figure 9F:
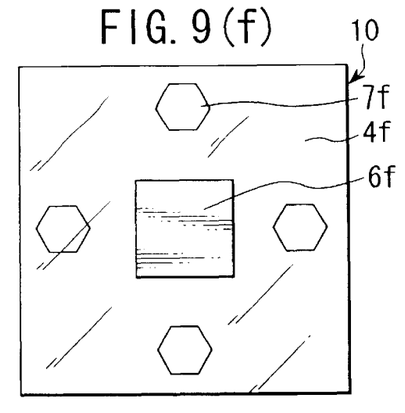
Figure 9G:
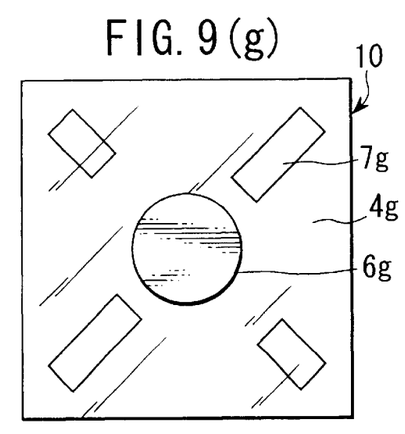
Figure 9H:
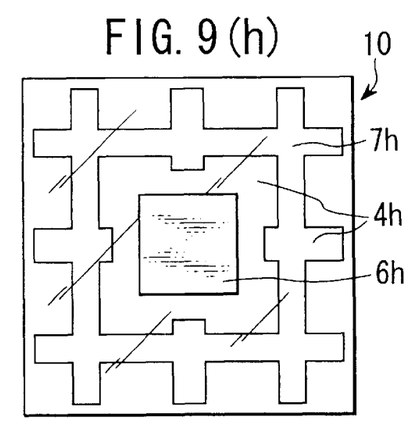
Figure 9I:
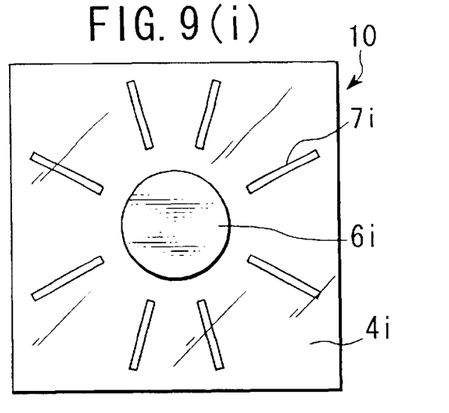
Figure 9J:
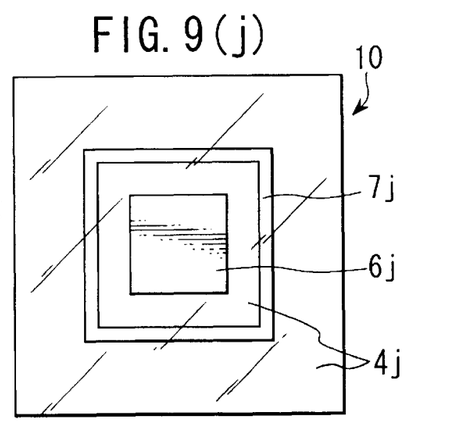
Figure 9K:
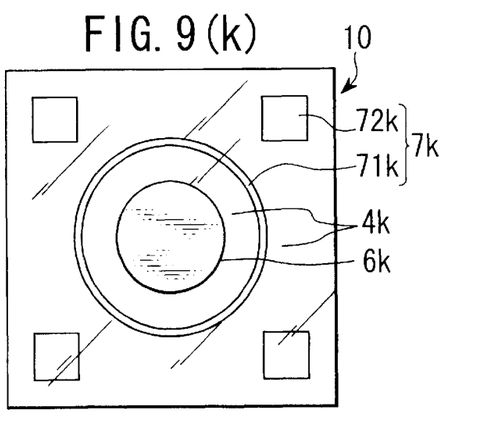
Figure 9L:
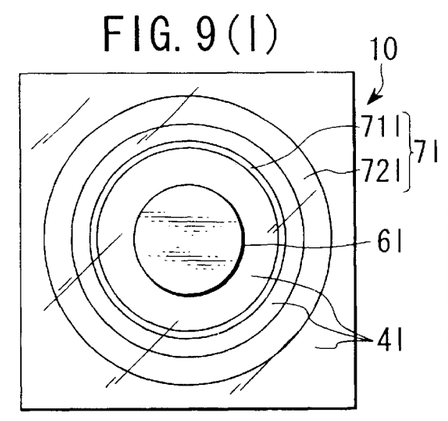
Figure 9M:
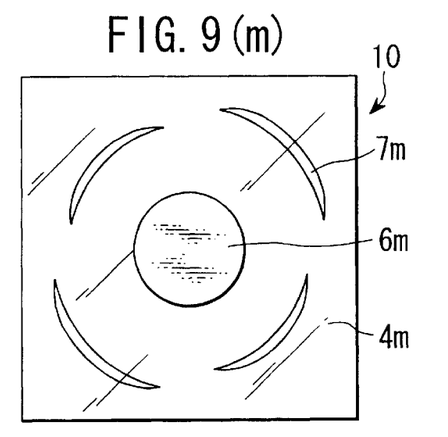
Figure 9N:
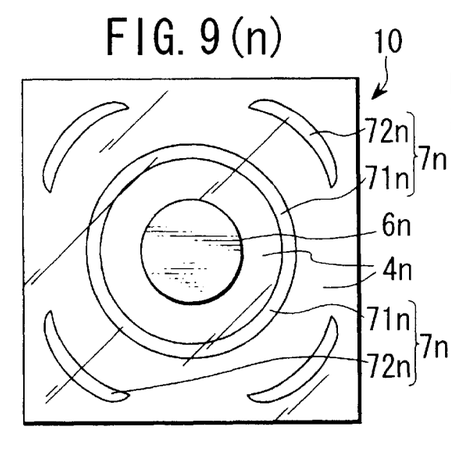
Figure 9O:
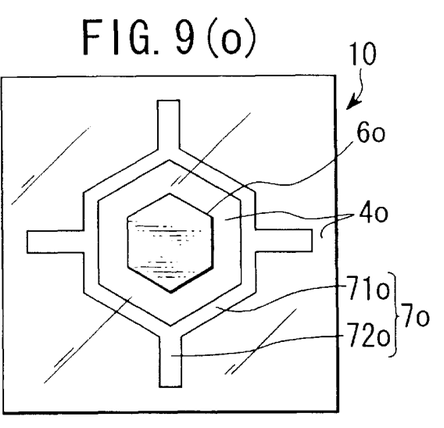
Figure 9P:
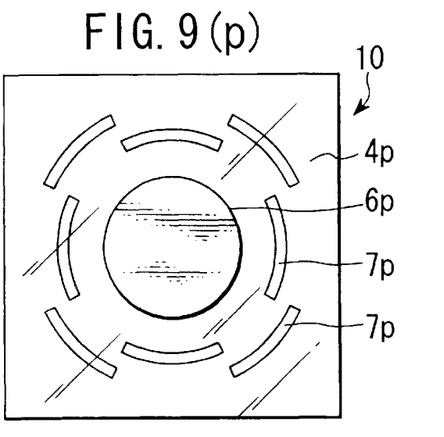
Figure 9Q:
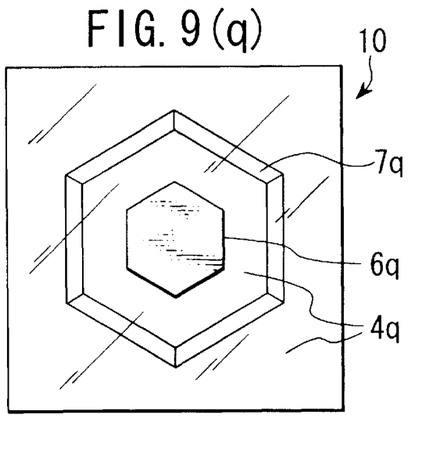
Figure 9R:
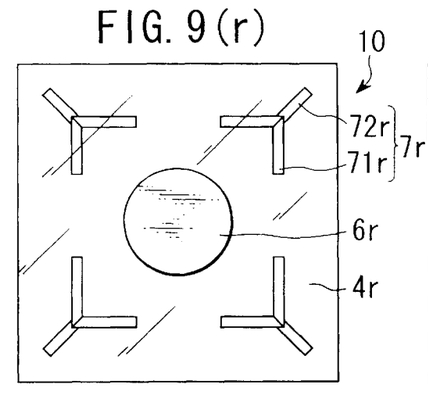
Figure 9S:
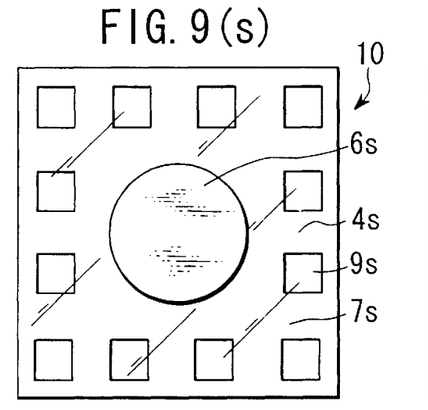
Figure 9T:
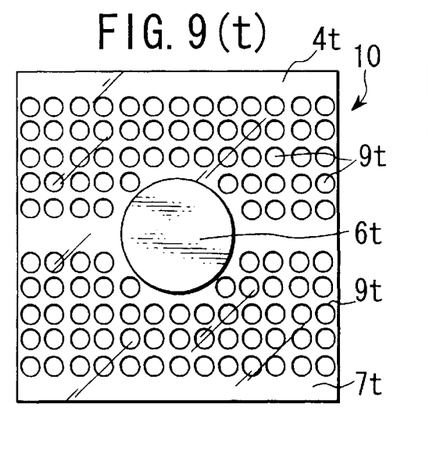
Figure 9U:
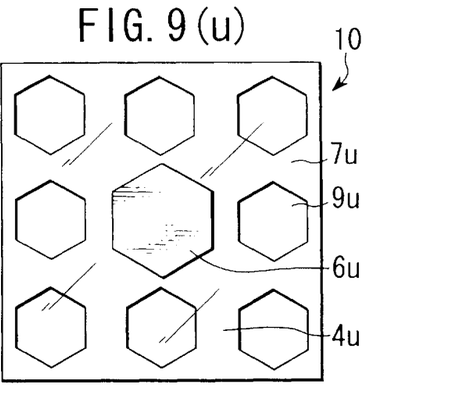
Figure 9V:
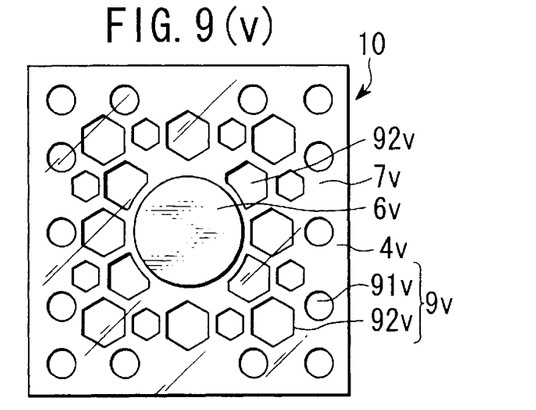
Figure 9W:
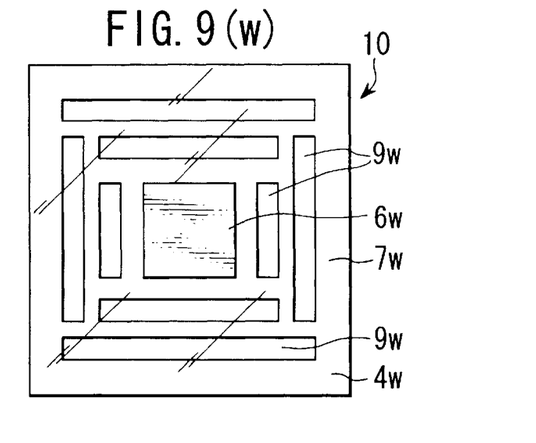
Figure 9X:
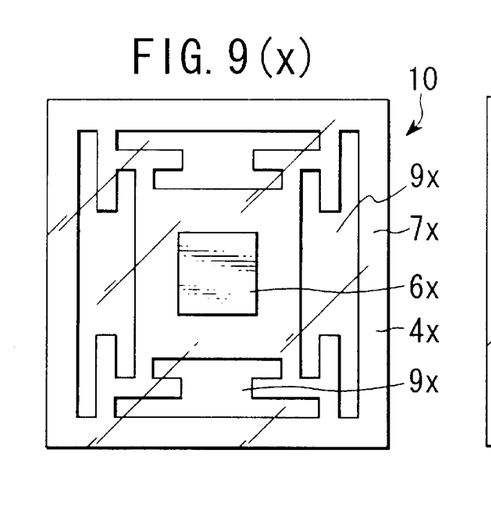
Figure 9Y:
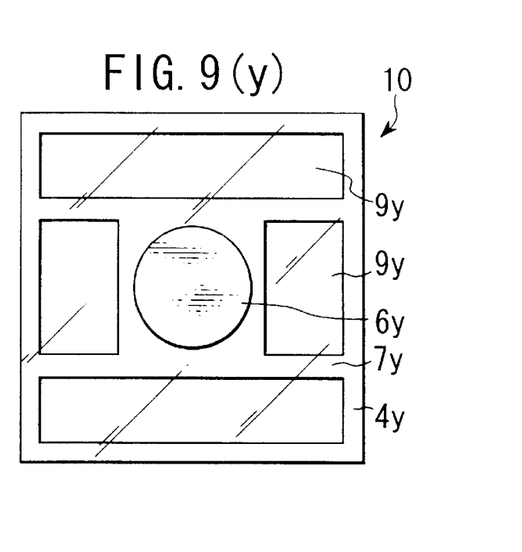

FIGS. 9(a) to 9(y) are plan views showing examples of the arrangement of the dispersed electrodes. In the foregoing embodiments, the dispersed electrodes (27, 37, 47) are disposed around the pad electrode 6 (26, 36, 46) so that they are individually scattered and do not overlap the pad electrode 6. However, they may be continuously connected and, if necessary, may be disposed in a state overlapping the pad electrode 6 (26, 36, 46). In FIGS. 9(a) to 9(y), the pad electrode 6 and dispersed electrode 7 are given reference symbols "a" to "y" corresponding to these figures, added to each of reference numerals 6 and 7. For example, the pad electrode and dispersed electrode in FIG. 9(a) are given reference symbols 6a and 7a, respectively. Each of the transparent conductive layers also given similar reference symbols 4a to 4r is formed to cover the dispersed electrode and the surface of the semiconductor layer (not shown).

The dispersed electrode 7a in FIG. 9(a) comprises a band-shaped rectangular frame body 71a that surrounds the pad electrode 6a, and branches 71b abundantly distributed perpendicular to the frame body 71a. The dispersed electrode 7b in FIG. 9(b) comprises two band-shape bodies 71b arranged on the opposite sides of the pad electrode 6b and a connection body 72b which passes through just below the pad electrode 6b to connect the two band-shaped bodies 71b. The dispersed electrode 7c in FIG. 9(c) comprises two rectangular flat bodies 7c disposed on the opposite sides of the pad electrode 6c. The dispersed electrode 7d in FIG. 9(d) comprises a band-shaped rectangular frame body 71d that surrounds the pad electrode 6d and four band-shaped bodies 72d extending in the radial direction from the corners of the frame body 71d. The dispersed electrode 7e in FIG. 9(e) comprises a honeycomb-shaped body 7e disposed on the entire surface of semiconductor layer (not shown) including a region just below the pad electrode 6e.

In FIG. 9(f) there are four polygonal dispersed electrodes 7f (regular hexagon) disposed around the square-shaped pad electrode 6f at the four sides thereof The dispersed electrode 7g in FIG. 9(g) comprises four band-shaped bodies 7g disposed on the diagonals of the square-shaped surface of the semiconductor layer (not shown). In FIG. 9(h) the dispersed electrode 7h comprises a lattice band-shaped body, with a part thereof corresponding to the region of the pad electrode 6h removed. The dispersed electrode 7i in FIG. 9(i) comprises a plurality of slender band-shaped bodies extending in the radial direction, with the pad electrode 6i as the center. The dispersed electrode 7j in FIG. 9(j) is a frame body surrounding the pad electrode 6j. The dispersed electrode 7k in FIG. 9(k) comprises an annular body 71k surrounding the pad electrode 6k and four square bodies 72k disposed on the diagonals of the square surface of the semiconductor layer (not shown). The dispersed electrode 7l in FIG. 9(l) comprises two annular bodies 71l and 72l disposed concentrically relative to the circular pad electrode 6l. The dispersed electrode 7m in FIG. 9(m) comprises two pairs of crescent-shaped bodies, each pair disposed on the circumference of a circle concentric with the pad electrode 6m. The dispersed electrode 7n in FIG. 9(n) comprises an annular body 71n surrounding the pad electrode 6n and four crescent-shaped bodies 72n disposed on the circumference of a circle concentric with the pad electrode 6n. The dispersed electrode 7o in FIG. 9(o) comprises a hexagonal frame body 71o surrounding the hexagonal pad electrode 6o and branches 72o extending outward from the frame body 71o. The dispersed electrode 7p in FIG. 9(p) comprises four arcuate bodies disposed on the circumference of a circle concentric with the pad electrode 6p and four arcuate bodies disposed on the circumference of a larger concentric circle. The dispersed electrode 7q in FIG. 9(q) comprises a plurality of band-shaped bodies connected to form a polygonal shape that can surround the polygonal pad electrode 6q. The dispersed electrode 7r in FIG. 9(r) comprises four band-shaped hooks 71r each bent at right angles and disposed on the diagonals of the square surface of the semiconductor layer (not shown) and branches 72r extending outward in the radial direction from the corners of the hooks 71r.

In FIGS. 9(s) to 9(y), the dispersed electrode is a metal film formed on the entire surface of the semiconductor layer (not shown), but removed at a position corresponding to the position of the pad electrode, and formed with holes. With this configuration, a light emission intercepted by the pad electrode is prevented from being induced in the semiconductor layer. The holes and remaining metal film (dispersed electrode) are covered by the transparent conductive layer (not shown), and the light emission induced in the semiconductor layer in the presence of the dispersed electrode is taken out via the holes and transparent conductive layer. The holes are given reference symbols "s" to "y" corresponding to these figures, added to each of reference numerals 9.

The dispersed electrode 7s in FIG. 9(s) is the metal film having a plurality of square holes 9s arranged in the peripheral region within the square surface of the semiconductor layer (not shown). The dispersed electrode 7t in FIG. 9(t) is the metal film having a great number of circular holes 9t arranged in the lateral and longitudinal directions within the square surface of the semiconductor layer (not shown). The dispersed electrode 7u in FIG. 9(u) is the metal film having a plurality of polygonal holes 9s arranged in the peripheral region within the square surface of the semiconductor layer (not shown). The dispersed electrode 7v in FIG. 9(v) is the metal film having a plurality of holes 9v consisting of circular holes 91v arranged in the peripheral region within the square surface of the semiconductor layer (not shown) and polygonal holes 92v disposed inside the circular holes 91v. The dispersed electrode 7w in FIG. 9(w) is the metal film having a plurality of band-shaped holes 9w arranged in the lateral and longitudinal directions within the square surface of the semiconductor layer (not shown). The dispersed electrode 7x in FIG. 9(x) is the metal film having a plurality of substantially H-shaped holes 9x arranged in the peripheral region within the square surface of the semiconductor layer (not shown). The dispersed electrode 7y in FIG. 9(y) is the metal film having a plurality of rectangular holes 9y arranged in the peripheral region within the square surface of the semiconductor layer (not shown).

As described above, the dispersed electrode includes individually dispersed ones, a band-shaped integral one, planar ones and a planar integral one with a plurality of holes.

When the dispersed electrodes are individually disposed, they may be in the shape of a square, a rectangle, a circle singly or in combination or in any other shape and also in a pattern that is radial, circular, spiral or in any other pattern. Further, in FIGS. 9(a) to 9(y), the transparent conductive film is given reference symbols "a" to "y" corresponding to these figures, added to reference numeral 4.

Figure 10:
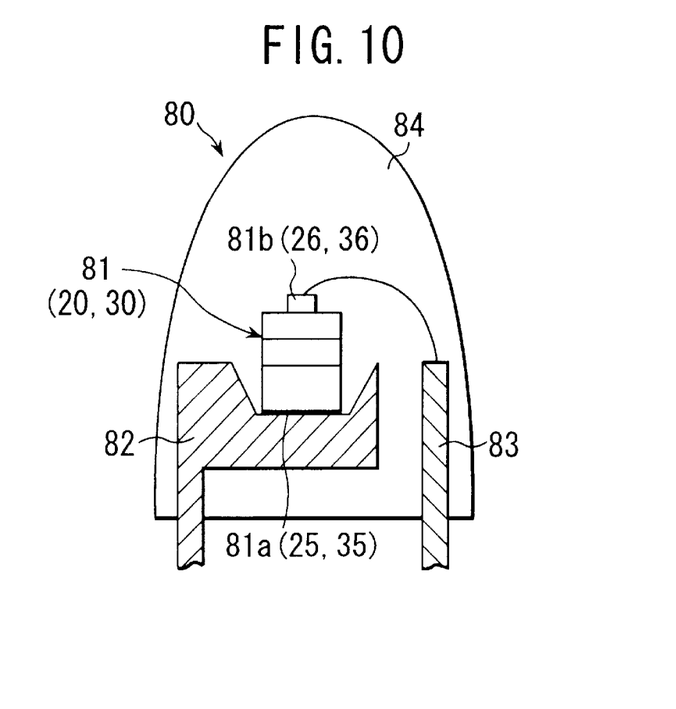
FIG. 10 is a schematic view showing one embodiment of an LED lamp using a semiconductor light-emitting device according to the present invention.

An LED lamp 80 fabricated using the semiconductor light-emitting device according to the present invention will be described.

FIG. 10 is a schematic view showing the LED lamp that comprises a semiconductor light-emitting device 81, a mount lead 82, an inner lead 83 and a molding of transparent resin 84.

The semiconductor light-emitting device 20 in the first embodiment or 30 in the second embodiment is used as the device 81. An electrode 81a (the p-type ohmic electrode 25 in the first embodiment or n-type one 35 in the second embodiment) is fixed onto the mount lead 82 to form electrical contact with the mount lead 82. A pad electrode 81b (the pad electrode 26 in the first embodiment or 36 in the second embodiment) is bonded to the inner lead 83 by wire-bonding.

In the conventional semiconductor light-emitting device disclosed in JP-A SHO 57(1982)-111076, a transparent conductive layer is formed to cover a pad electrode. With this configuration, since the conductive layer is transparent, it is difficult to recognize the region of the transparent conductive layer. As a result, there is a possibility of the surface of the transparent conductive layer is subjected to wire-bonding, resulting in a state of a wire not adhering to the pad electrode. In the present invention, however, such inconvenience can be eliminated because no transparent conductive layer exists on the surface of the pad electrode subjected to wire-bonding.

Since the LED lamp 80 has the semiconductor light-emitting device of the present invention, the light-emitting efficiency thereof is higher than a conventional one, and the service life characteristic thereof is enhanced.

Furthermore, the LED lamp 80 can be used as a lighting implement for vehicles, railway rolling stock, traffic signals, railroad crossing signals, road-shoulder pilot lamps and eye guide lamps. It can also be used as a light source for monitor indicators, operation plate indicators, office machines including duplicators and facsimile machines, information panels used outdoors, etc. In this case, the light source using the LED lamp 80 of the present invention exhibits a higher light-emitting efficiency and a more enhanced service life characteristic than a conventional one.

As has been described in the foregoing, in the semiconductor light-emitting device of the present invention, dispersed electrodes are individually provided on a part of the surface of a semiconductor layer so that they make ohmic contact with the semiconductor layer. This configuration enables the electrical resistance between the dispersed electrodes and the semiconductor layer to be much smaller than that between a transparent conductive film and the semiconductor layer. The major part of a driving current supplied from a pad electrode flows successively to a transparent conductive film, the dispersed electrodes and the semiconductor layer (light-emitting portion) in the direction offering lower electrical resistance. Therefore, light emission from the light-emitting portion can be performed around the dispersed electrodes. Moreover, since almost all of the dispersed electrodes are disposed so as not to overlap the pad electrode, light emission toward just below the pad electrode does not occur. Accordingly, the major part of the emitted light is not intercepted by the pad electrode and can be taken out from the upper portion of the semiconductor light-emitting device, thus improving the light-emitting efficiency to a great extent. Furthermore, since the area of the dispersed electrodes is set to be smaller than that of the pad electrode, light can be taken out to the outside with a better light-emitting efficiency than that of a conventional light-emitting device.

In addition, since the electrical resistance between the dispersed electrodes and the semiconductor layer becomes smaller, it is possible to reduce the forward current of the semiconductor light-emitting device, thus enhancing the service life characteristic of the device.

Moreover, the transparent conductive film exhibits a good transmissivity, so that the light from the light-emitting portion is little absorbed during passing through the transparent conductive film and can be taken out upward from the transparent conductive film with a high efficiency.

The light emitted based on the driving current from the pad electrode flowing in the direction just below the pad electrode is intercepted by the pad electrode, resulting in waste of power consumption. For this reason, the countermeasure such as provision of an insulating layer between the pad electrodes and the light-emitting portion has been taken to forcibly prevent the driving current from flowing from the pad electrode to the direction just below the pad electrode. In the present invention, the driving current can be guided to the dispersed electrodes using a simplified constitution that can prevent the driving current from flowing to the direction just below the pad electrode without using an insulating layer.

While the invention has been described in detail and with reference to specific embodiments thereof, it will be apparent to one skilled in the art that various changes and modifications can be made therein without departing from the spirit and scope thereof.

What is claimed is:

1. A semiconductor light-emitting device comprising:
   a semiconductor substrate having a rear surface on which a first electrode is formed;
   a semiconductor layer including a light-emitting portion, that is formed on said semiconductor substrate;
   dispersed electrodes individually formed on a part of a surface of said semiconductor layer, said dispersed electrodes being made of metal, obstructing takeout of emitted light and making ohmic contact with said semiconductor layer;
   a transparent conductive film formed so as to cover the surface of said semiconductor layer and said dispersed electrodes, said transparent conductive film electrically conducting with said dispersed electrodes; and
   a pad electrode formed on a part of a surface of said transparent conductive film, said pad electrode electrically conducting with the transparent conductive film.

2. The semiconductor light-emitting device as claimed in claim 1, wherein said dispersed electrodes are formed on the surface of said semiconductor layer around said pad electrode.

3. The semiconductor light-emitting device as claimed in claim 1, wherein said dispersed electrodes are formed on the surface of said semiconductor layer at portions where said dispersed electrodes do not overlap said pad electrode.

4. The semiconductor light-emitting device as claimed in claim 1, wherein said dispersed electrodes are not formed on the surface of said semiconductor layer at portions where said dispersed electrodes overlap said pad electrode.

5. The semiconductor light-emitting device as claimed in claim 1, wherein said light-emitting portion is made of AlGaInP.

6. The semiconductor light-emitting device as claimed in claim 1, wherein said semiconductor layer is formed by a metal organic chemical vapor deposition method.

7. The semiconductor light-emitting device as claimed in claim 1, wherein said transparent conductive film is made of indium tin oxide.

8. The semiconductor light-emitting device as claimed in claim 1, wherein said pad electrode has a surface to be subjected to wire bonding, that is free of said transparent conductive film.

9. The semiconductor light-emitting device as claimed in claim 1, wherein said pad electrode is disposed at a center of a top surface of said semiconductor light-emitting device.

10. An electrode for a semiconductor light-emitting device comprising:

dispersed electrodes formed on a part of a surface of a semiconductor layer including a light-emitting portion, said dispersed electrodes being made of metal, obstructing takeout of emitted light and making ohmic contact with said semiconductor layer;

a transparent conductive film formed so as to cover the surface of said semiconductor layer and said dispersed electrodes, said transparent conductive film electrically conducting with said dispersed electrodes; and a pad electrode formed on a part of a surface of said transparent conductive film, said pad electrode electrically conducting with the transparent conductive film.

11. The electrode for a semiconductor light-emitting device as claimed in claim 10, wherein said dispersed electrodes are formed on the surface of said semiconductor layer around said pad electrode.

12. The electrode for a semiconductor light-emitting device as claimed in claim 10, wherein said dispersed electrodes are formed on the surface of said semiconductor layer at portions where said dispersed electrodes do not overlap said pad electrode.

13. The electrode for a semiconductor light-emitting as claimed in claim 10, wherein said dispersed electrodes are not formed on the surface of said semiconductor layer at portions where said dispersed electrodes overlap said pad electrode.

14. The electrode for a semiconductor light-emitting device as claimed in claim 10, wherein said transparent conductive film is made of indium tin oxide.

15. The electrode for a semiconductor light-emitting device as claimed in claim 10, wherein said pad electrode has a surface to be subjected to wire bonding, that is free of said transparent conductive film.

16. The electrode for a semiconductor light-emitting device as claimed in claim 10, wherein said pad electrode is disposed at a center of a top surface of said semiconductor light-emitting device.

17. An LED lamp comprising the semiconductor light-emitting device as claimed in claim 1.

18. A light source comprising the LED lamp as claimed in claim 17.

* * * * *